(12) United States Patent
Nishitsuji et al.

(10) Patent No.: US 6,300,190 B1
(45) Date of Patent: Oct. 9, 2001

(54) METHOD FOR FABRICATING SEMICONDUCTOR INTEGRATED CIRCUIT DEVICE

(75) Inventors: Mitsuru Nishitsuji; Yoshiharu Anda, both of Osaka; Katsuhiko Kawashima, Hyogo; Tsuyoshi Tanaka, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/452,389

(22) Filed: Dec. 1, 1999

(30) Foreign Application Priority Data

Dec. 9, 1998 (JP) .................................................. 10-350098

(51) Int. Cl.⁷ ............................................... H01L 21/8242
(52) U.S. Cl. ......................... 438/253; 438/258; 438/396
(58) Field of Search ............................... 438/3, 240, 250, 438/239, 241, 393, 234, 171, 197, 210, 238, 386, 399, 253, 258, 396; 257/532–535, 296

(56) References Cited

U.S. PATENT DOCUMENTS 6,169,304 * 1/2001 Arital et al. ........................ 257/295

FOREIGN PATENT DOCUMENTS

406232340-A * 8/1994 (JP) .

OTHER PUBLICATIONS

Hidetoshi ISHIDA et al., "Low Current Wideband Amplifier Using 0.2 μm Gate MODFET Fabricated by Using Phase–Shift Lithography", Extended Abstract of 1996 IEEE GaAS–IC Symposium, pp. 249–252.

* cited by examiner

Primary Examiner—Olik Chaudhuri
Assistant Examiner—Theresa T. Doan
(74) Attorney, Agent, or Firm—Eric J. Robinson; Nixon Peabody LLP

(57) ABSTRACT

First, an insulating film is formed over the entire surface of a semiconductor substrate including a channel region for a field effect transistor. The insulating film has a gate electrode opening over the channel region. Next, a protective film is deposited over the entire surface of the insulating film. Then, a lower electrode, a capacitive insulating film and an upper electrode are formed in this order in a region on the protective film where a capacitor will be formed. Subsequently, part of the protective film, with which the gate electrode opening of the insulating film has been filled in, is removed, thereby exposing the semiconductor substrate within the gate electrode opening. And then a gate electrode is formed to fill in the gate electrode opening again.

11 Claims, 8 Drawing Sheets

METHOD FOR FABRICATING SEMICONDUCTOR INTEGRATED CIRCUIT DEVICE

BACKGROUND OF THE INVENTION

The present invention relates to a method for fabricating a semiconductor integrated circuit device including field effect transistors (FETS) and capacitors that are integrated together on the same semiconductor substrate.

Hereinafter, a known method for fabricating a semiconductor integrated circuit device including FET and capacitor on the same substrate will be described with reference to FIGS. 7A through 7E.

First, although not shown, a channel region and respective doped regions to be source/drain regions are defined in predetermined regions within a semiconductor substrate 1. Next, the surface of the substrate 1 is coated with a resist film, which is then patterned by a phase-shifting technique. In this manner, a fine-line resist pattern 2 is formed in a region on the substrate 1 (i.e., a region over the channel region) where a gate electrode will be formed, as shown in FIG. 7A.

Subsequently, as shown in FIG. 7B, an insulating film 3 of silicon dioxide is deposited over the entire surface of the substrate 1 and the resist pattern 2 is lifted off. As a result, an opening 3a is formed in the insulating film 3 for the gate electrode of an FET. In this specification, this opening 3a will be called a "gate electrode opening" for convenience sake.

Then, as shown in FIG. 7C, a lower electrode 4A is formed in a region over the insulating film 3 where a capacitor will be formed. Thereafter, as shown in FIG. 7D, a strontium titanate (SrTiO$_3$) film 5 and a metal film 6 are deposited in this order by plasma-enhanced RF sputtering over the entire surface of the insulating film 3 as well as over the lower electrode 4. In the next process step, these films 5 and 6 will be shaped into capacitive insulating film and upper electrode, respectively.

Next, the metal film 6 and SrTiO$_3$ film 5 are wet-etched, thereby forming the upper electrode 6A and capacitive insulating film 5A, respectively, as shown in FIG. 7E.

Finally, as shown in FIG. 7F, metallization is carried out to fill in the opening 3a of the insulating film 3 and thereby form a gate electrode 7. Also, ohmic electrodes 8 are formed as source/drain electrodes on right- and left-hand sides of the gate electrode 7. As a result, a conventional semiconductor integrated circuit device including FET and capacitor is obtained.

The prior art method, however, has the following drawbacks. Specifically, in the process step shown in FIG. 7D of depositing the SrTiO$_3$ film 5 by plasma-enhanced RF sputtering, a surface region of the substrate 1, e.g., the channel region, in particular, is unintentionally exposed to the plasma through the gate electrode opening 3a of the insulating film 3. Then, crystal imperfections are caused in the channel region to considerably decrease the mobility of electrons traveling therethrough. Specifically, once the SrTiO$_3$ film 5 is deposited, the electron mobility in the channel region decreases from about 5500 cm$^2$/V·sec. to about 3200 cm$^2$/V·sec. As a result, the operating characteristics of the FET deteriorate.

It is not impossible to prevent the substrate 1 from being exposed to the plasma through the gate electrode opening 3a by depositing the SrTiO$_3$ film 5 before the opening 3a has been formed in the insulating film 3. However, another problem arises in such a case. This new problem will be described below with reference to FIG. 8.

According to this alternate technique, a capacitor, consisting of the lower electrode 4A, capacitive insulating film 5A and upper electrode 6, is formed on the insulating film 3 that has been deposited on the semiconductor substrate 1. Then, the entire surface of the substrate 1 is coated with a resist film 9 as shown in FIG. 8. In such a case, a level difference exists between the capacitor and surrounding regions thereof on the insulating film 3, and the thickness of the resist film 9 is non-uniform. Thus, if the resist film 9 is irradiated with exposing radiation L$_E$ to provide a gate electrode opening 9a in the resist film 9, the exposing radiation L$_E$, which has passed through the resist film 9, is diffused by the level difference portion of the capacitor toward the surrounding regions. As a result, the opening 9a of the resist film 9 has its size increased or decreased from the desired one due to the reflected radiation L$_R$. Accordingly, if the insulating film 3 is etched to form the gate electrode opening 3a therethrough using the resist film 9 with such an opening 9a as a mask, then the size of the resulting gate electrode opening 3a deviates from the predetermined value. This problem gets even more serious when the resist film 9 is provided with the opening 9a by a phase-shifting technique.

Thus, to provide a gate electrode opening of a very small size for the insulating film 3, the capacitor has to be formed after the gate electrode opening 3a has been provided in the insulating film 3, not before.

SUMMARY OF THE INVENTION

An object of the present invention is eliminating crystal imperfections from the channel region of a semiconductor substrate and thereby avoiding decrease in electron mobility in the channel region even though a capacitive insulating film is deposited after a gate electrode opening has been provided in an insulating film.

To achieve this object, a first exemplary method for fabricating a semiconductor integrated circuit device according to the present invention includes the steps of: a) forming an insulating film over the entire surface of a semiconductor substrate including a channel region for a field effect transistor, the insulating film having a gate electrode opening over the channel region; b) depositing a protective film over the entire surface of the insulating film; c) forming a lower electrode, a capacitive insulating film and an upper electrode in this order in a region on the protective film where a capacitor will be formed; d) removing part of the protective film, with which the gate electrode opening of the insulating film has been filled in, thereby exposing the semiconductor substrate within the gate electrode opening; and e) forming a gate electrode to fill in the gate electrode opening again.

According to the first method of the present invention, after a protective film has been deposited on an insulating film having a gate electrode opening, a capacitive insulating film is formed over the protective film. That is to say, when the capacitive insulating film is formed, the gate electrode opening of the insulating film is filled in with the protective film. Accordingly, it is possible to prevent crystal imperfections from being caused in the channel region of the semiconductor substrate in the process step of depositing the capacitive insulating film. Consequently, the electron mobility does not decrease in the channel region, thus preventing the operating characteristics of the field effect transistor from being deteriorated.

A second exemplary method for fabricating a semiconductor integrated circuit device according to the present invention includes the steps of: a) forming an insulating film over the entire surface of a semiconductor substrate include ing a channel region for a field effect transistor; b) defining a mask pattern on the insulating film, the mask pattern having an opening over the channel region; c) depositing a protective film over the entire surface of the insulating film as well as over the mask pattern; d) forming a lower electrode, a capacitive insulating film and an upper electrode in this order in a region on the protective film where a capacitor will be formed; e) removing part of the protective film, thereby exposing the insulating film inside the opening of the mask pattern, the part removed being located in a region where the field effect transistor will be formed; f) etching the insulating film through the mask pattern, thereby forming a gate electrode opening in the insulating film; and g) forming a gate electrode to fill in the gate electrode opening.

According to the second method of the present invention, after a capacitive insulating film has been formed over a protective film deposited on an insulating film, a gate electrode opening is formed in the insulating film by etching the insulating film with a mask pattern having an opening. That is to say, the gate electrode opening is not formed in the insulating film until the capacitive insulating film has been formed. Accordingly, it is possible to prevent crystal imperfections from being caused in the channel region of the semiconductor substrate in the process step of depositing the capacitive insulating film. Consequently, the electron mobility does not decrease in the channel region, thus preventing the operating characteristics of the field effect transistor from being deteriorated.

A third exemplary method for fabricating a semiconductor integrated circuit device according to the present invention includes the steps of: a) forming an insulating film over the entire surface of a semiconductor substrate including a channel region for a field effect transistor, the insulating film having a gate electrode opening over the channel region; b) forming a lower electrode in a region on the insulating film where a capacitor will be formed; c) forming a protective film over the insulating film to cover surrounding regions of the lower electrode and the gate electrode opening of the insulating film, the protective film having an opening over a center region of the lower electrode; d) forming a capacitive insulating film over the lower electrode and the protective film such that part of the capacitive insulating film comes into contact with the lower electrode through the opening of the protective film; e) forming an upper electrode on the capacitive insulating film; f) removing part of the protective film, with which the gate electrode opening of the insulating film has been filled in, thereby exposing the semiconductor substrate within the gate electrode opening; and g) forming a gate electrode to fill in the gate electrode opening.

According to the third method of the present invention, after a protective film has been deposited over an insulating film having a gate electrode opening, a capacitive insulating film is formed on the protective film. That is to say, when the capacitive insulating film is formed, the gate electrode opening of the insulating film is covered with the protective film. Accordingly, it is possible to prevent crystal imperfections from being caused in the channel region of the semiconductor substrate in the process step of depositing the capacitive insulating film. Consequently, the electron mobility does not decrease in the channel region, thus preventing the operating characteristics of the field effect transistor from being deteriorated.

In addition, the protective film is interposed between the surrounding region of the capacitive insulating film and that of the lower electrode. That is to say, the surrounding region of the capacitive insulating film, through which leakage current is likely to flow, is not in direct contact with the lower electrode. As a result, the leakage current can be reduced.

DESCRIPTION OF THE PREFERRED EMBODIMENTS EMBODIMENT 1

Hereinafter, a method for fabricating a semiconductor integrated circuit device according to a first embodiment of the present invention will be described with reference to FIGS. 1A through 2C.

Figure 1A:
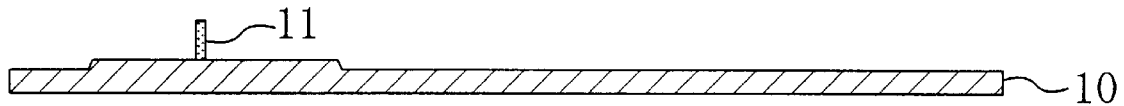
FIGS. 1A through 2C are cross-sectional views illustrating respective process steps for fabricating a semiconductor integrated circuit device according to a first embodiment of the present invention.

First, although not shown, a channel region and respective doped regions to be source/drain regions are formed by a known technique in predetermined regions within a semiconductor substrate 10 of GaAs. Next, the surface of the substrate 10 is coated with a resist film, which is then patterned by a phase-shifting technique. In this manner, a fine-line resist pattern 11 is formed in a region on the substrate 10 (i.e., a region over the channel region) where a gate electrode will be formed, as shown in FIG. 1A. In this case, either negative or positive resist may be used as the resist pattern 11.

Figure 1B:
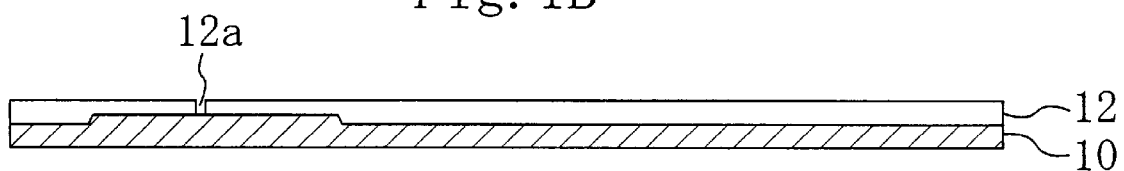

Subsequently, as shown in FIG. 1B, an insulating film 12 of silicon dioxide is deposited by an electron beam evaporation technique over the entire surface of the substrate 10 and then the resist pattern 11 is lifted off. As a result, a gate electrode opening 12a of a very small size is formed in the insulating film 12.

Figure 1C:
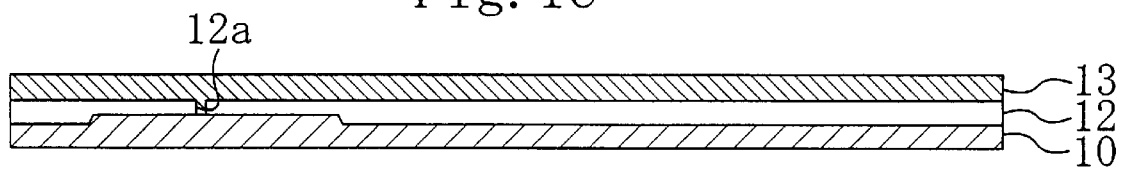

Then, as shown in FIG. 1C, a protective film 13 of aluminum, for example, is deposited over the entire surface of the insulating film 12.

Figure 1D:
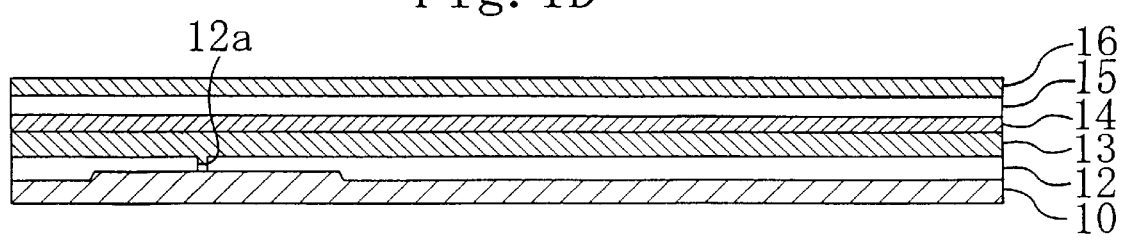

Subsequently, as shown in FIG. 1D, a first metal film 14, which will be patterned into a lower electrode, is deposited on the protective film 13. Then, an $SrTiO_3$ film 15, which will be patterned into a capacitive insulating film, is deposited by plasma-enhanced RF sputtering over the first metal film 14. In this process step, the gate electrode opening 12a of the insulating film 12 is covered with the protective film 13. Accordingly, even if the SrTiO$_3$ film 15 is deposited by plasma-enhanced RF sputtering, the channel region of the semiconductor substrate 10 (where electrons travel) receive no damage, thus maintaining excellent crystalline structure. Thereafter, a second metal film 16, which will be patterned into an upper electrode, is deposited on the SrTiO$_3$ film 15.

Figure 2A:
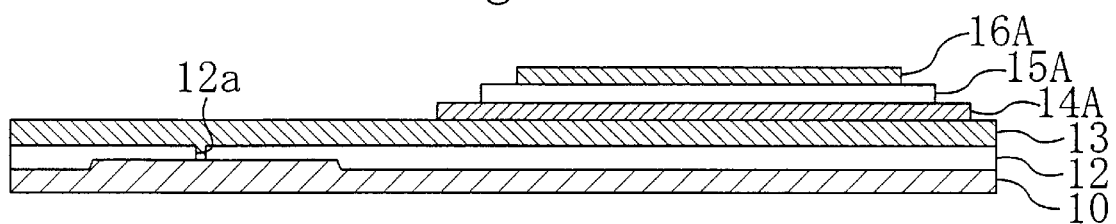

Next, the second metal film 16, SrTiO$_3$ film 15 and first metal film 14 are patterned in this order by a known ion milling technique, thereby forming a capacitor consisting of upper electrode 16A, capacitive insulating film 15A and lower electrode 14A as shown in FIG. 2A.

Figure 2B:
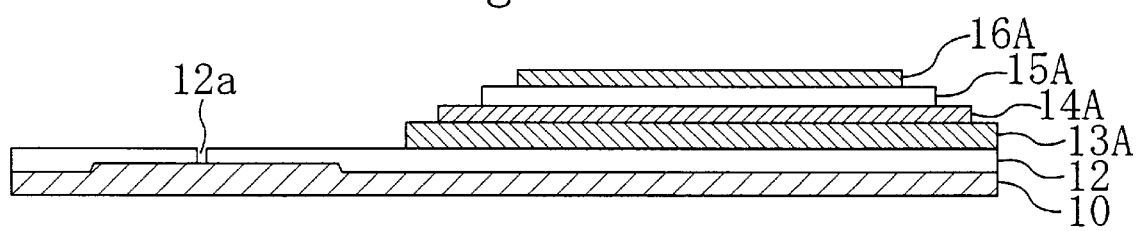

Thereafter, the protective film 13 is patterned by known lithography and wet etching techniques using hydrochloric acid, thereby forming a pattern protective film 13A under the capacitor as shown in FIG. 2B. In the illustrated embodiment, the insulating film 12 is made of silicon dioxide and the protective film 13 is made of aluminum. Accordingly, only the protective film 13 is etched, but the insulating film 12 is not, as a result of the wet etching process using hydrochloric acid. Thus, the insulating film 12 is left as it is and the gate electrode opening 12a and the semiconductor substrate 10 are both exposed.

Figure 2C:
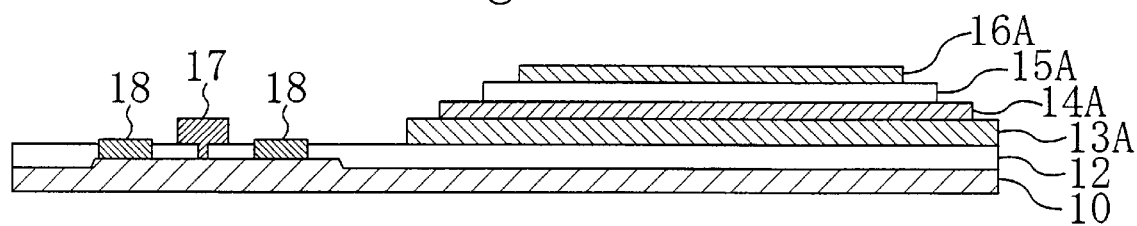

Finally, as shown in FIG. 2C, metallization is carried out to fill in the gate electrode opening 12a of the insulating film 12 and thereby form a gate electrode 17. Also, ohmic electrodes 18 are formed as source/drain electrodes on right- and left-hand sides of the gate electrode 17. As a result, a semiconductor integrated circuit device including FET and capacitor according to the first embodiment is obtained.

In the method of the first embodiment, after the gate electrode opening 12a of the insulating film 12 has been covered with the protective film 13, the SrTiO$_3$ film 15 is deposited by plasma-enhanced RF sputtering. Thus, the channel region of the semiconductor substrate 10 does not receive any damage as a result of sputtering. Consequently, the electron mobility does not decrease in the channel region, thus preventing the operating characteristics of the field effect transistor from being deteriorated.

In addition, the protective film 13 of aluminum is wet-etched and patterned using hydrochloric acid. Thus, even if the protective film 13 is over-etched after the gate electrode opening 12a has been completely exposed, the insulating film 12 is not etched. Accordingly, it is possible to maintain the very small size of the gate electrode opening 12a.

Figure 3:
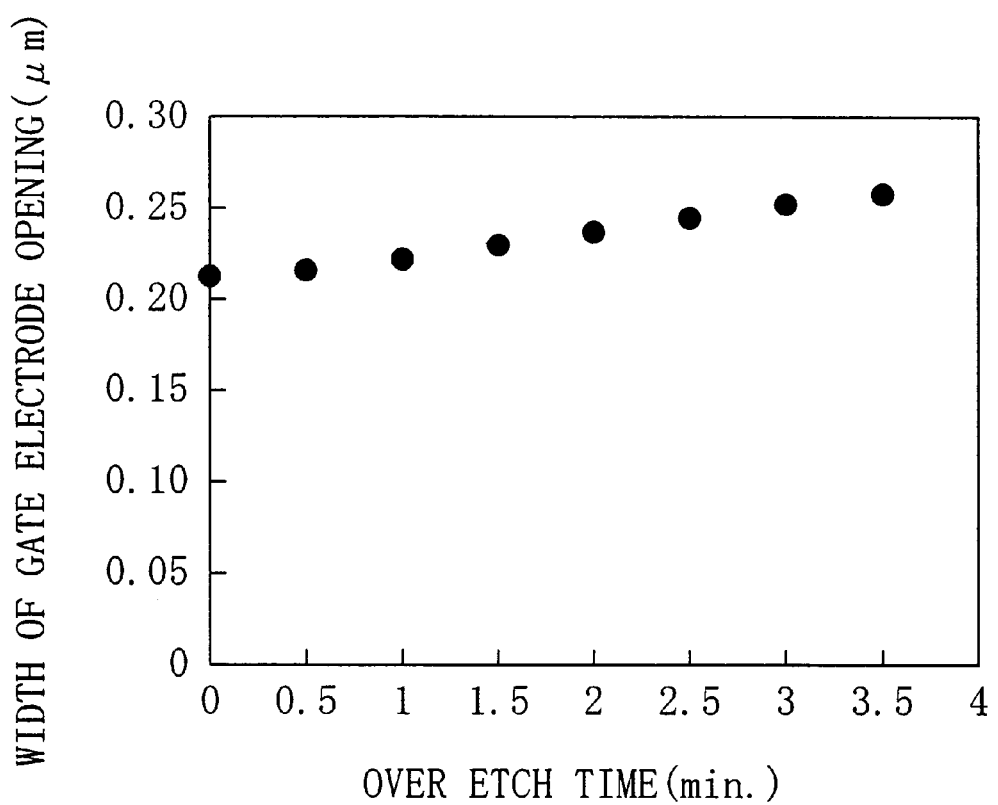
FIG. 3 is a graph illustrating a relationship between an over etch time and the width of a gate electrode opening in the process step of etching a protective film according to the method of the first embodiment.

FIG. 3 illustrates a relationship between an over etch time and the width of the gate electrode opening 12a. As can be seen from FIG. 3, so long as the over etch time is 2 minutes or less, the increase in width of the gate electrode opening 12a is within 10 percent, and therefore, the characteristics of the FET do not deteriorate.

MODIFIED EXAMPLE OF EMBODIMENT 1

Hereinafter, a method for fabricating a semiconductor integrated circuit device according to a modified example of the first embodiment will be described with reference to FIGS. 1A, 1B, 4, 2A and 2B.

First, as in the first embodiment, a channel region and respective doped regions to be source/drain regions are formed in predetermined regions within the semiconductor substrate 10 of GaAs. Next, the fine-line resist pattern 11 is defined in a region on the substrate 10 (i.e., a region over the channel region) where a gate electrode will be formed, as shown in FIG. 1A.

Subsequently, as shown in FIG. 1B, the insulating film 12 of silicon dioxide is deposited over the entire surface of the substrate 10 and then the resist pattern 11 is lifted off. As a result, the gate electrode opening 12a is formed in the insulating film 12.

Figure 4:
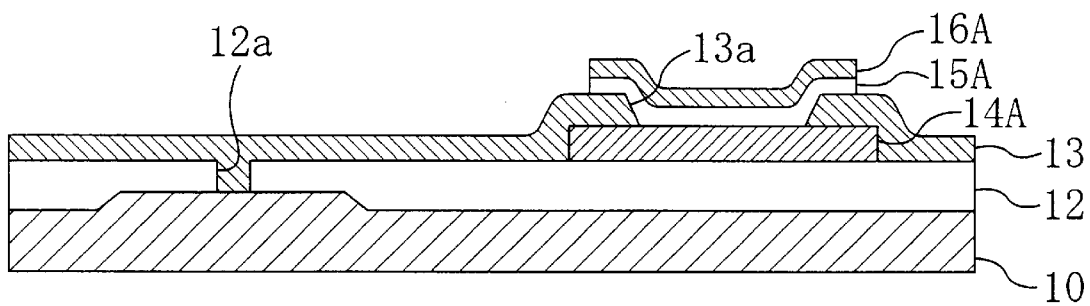
FIG. 4 is a cross-sectional view illustrating a process step of a method for fabricating a semiconductor integrated circuit device in a modified example of the first embodiment.

Next, a lower electrode 14A is formed in a region on the insulating film 12 where a capacitor will be formed as shown in FIG. 4. Then, a protective film 13 of aluminum is formed to cover regions surrounding the lower electrode 14A and a region of the insulating film 12 where an FET will be formed. The protective film 13 is provided with an opening 13a over the center region of the lower electrode 14A. An SrTiO$_3$ film, which will be patterned into a capacitive insulating film, is deposited over the lower electrode 14A and the protective film 13 and then a metal film, which will be patterned into an upper electrode, is deposited on the SrTiO$_3$ film. Thereafter, the metal film and SrTiO$_3$ film are patterned, thereby forming an upper electrode 16A and a capacitive insulating film 15A. A capacitor is made up of the upper electrode 16A, capacitive insulating film 15A and lower electrode 14A.

Next, as in the first embodiment shown in FIG. 2B, the protective film 13 is patterned so as to leave only a part 13a thereof around the capacitor. In the illustrated embodiment, the insulating film 12 is made of silicon dioxide and the protective film 13 is made of aluminum. Accordingly, if the protective film 13 is wet-etched with hydrochloric acid, only the protective film 13 is etched, but the insulating film 12 is not. Thus, the insulating film 12 is left as it is and the gate electrode opening 12a and the semiconductor substrate 10 are both exposed.

Finally, as in the first embodiment shown in FIG. 2C, metallization is carried out to fill in the gate electrode opening 12a of the insulating film 12 and thereby form the gate electrode 17. Also, the ohmic electrodes 18 are formed as source/drain electrodes on right- and left-hand sides of the gate electrode 17. As a result, a semiconductor integrated circuit device including FET and capacitor according to a modified example of the first embodiment is obtained.

In this modified example of the first embodiment, part 13a of the protective film 13 is interposed between the surrounding region of the capacitive insulating film 15A and that of the lower electrode 14A. That is to say, the surrounding region of the capacitive insulating film 15A, through which leakage current is likely to flow, is not in direct contact with the lower electrode 14A. As a result, the leakage current can be reduced. In this case, if the protective film 13 is made of silicon nitride excelling in insulation properties, then the leakage current can be further reduced.

In the foregoing first embodiment and its modified example, the protective film 13 of aluminum is deposited on the insulating film 12 of silicon dioxide and then patterned by a wet etching technique using hydrochloric acid. Alternatively, a protective film 13 of silicon nitride may be deposited on the insulating film 12 of silicon dioxide and then patterned by a dry etching technique using CF$_4$ gas. In such an embodiment, the silicon nitride film as the protective film 13 is easily etched with the CF$_4$ gas, but the silicon dioxide film as the insulating film 12 is not. Specifically, the etch rate of the silicon dioxide film is about one-fortieth of that of the silicon nitride film.

The insulating film 12 and the protective film 13 may be made of any other combination of materials than the exemplified one so long as the insulating film 12 is not etched when the protective film 13 is etched. Specifically, when the insulating film 12 is made of silicon dioxide or silicon nitride, the protective film 13 may be a single- or multi-layer film including at least one of aluminum, titanium, gold and tungsten films.

EMBODIMENT 2

Hereinafter, a method for fabricating a semiconductor integrated circuit device according to a second embodiment of the present invention will be described with reference to FIGS. 5A through 6D.

Figure 5A:
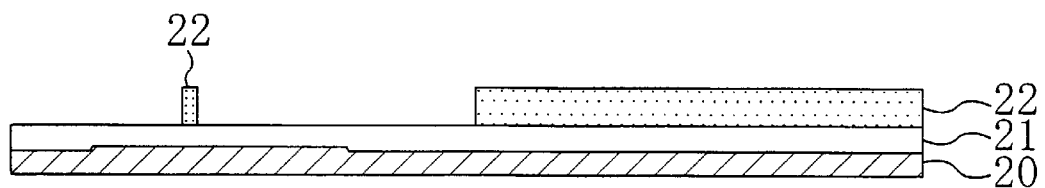
FIGS. 5A through 6D are cross-sectional views illustrating respective process steps for fabricating a semiconductor integrated circuit device according to a second embodiment of the present invention.
Figure 5B:
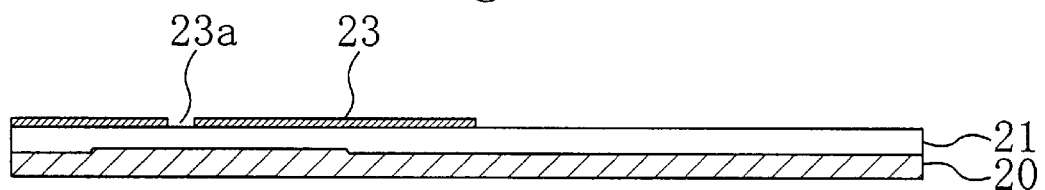

First, although not shown, a channel region and respective doped regions to be source/drain regions are formed by a known technique in predetermined regions within a semiconductor substrate 20 of GaAs. Next, an insulating film 21 of silicon dioxide is formed on the semiconductor substrate 20. Then, the surface of the insulating film 21 is coated with a resist film, which is then patterned by a phase-shifting technique. In this manner, a first resist pattern 22 is formed in respective regions over the substrate 20 where a gate electrode and a capacitor will be formed, as shown in FIG. 5A.

Subsequently, an aluminum film is deposited by an electron beam evaporation technique over the entire surface of the substrate 20 and then the first resist pattern 22 is lifted off. As a result, a hard mask 23 with an opening 23a for forming a gate electrode is defined in the region over the semiconductor substrate 20 where an FET will be formed.

Figure 5C:
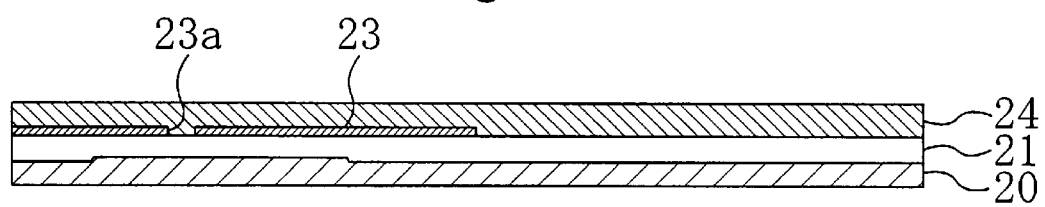

Then, as shown in FIG. 5C, a protective film 24 of silicon nitride, for example, is deposited over the entire surface of the insulating film 21.

Figure 5D:
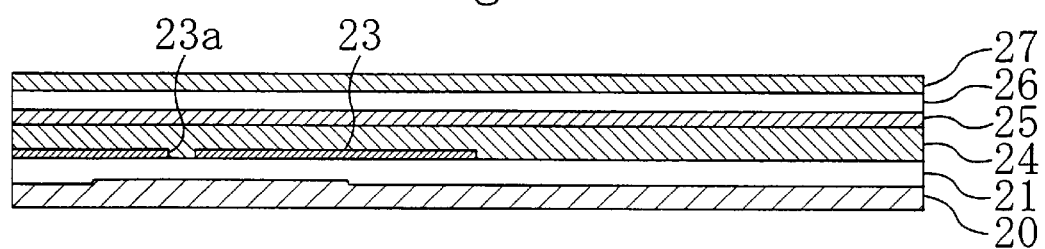

Subsequently, as shown in FIG. 5D, a first metal film 25, which is made of Ti and Pt layers alternately stacked and which will be patterned into a lower electrode, is deposited on the protective film 24. Then, an $SrTiO_3$ film 26, which will be patterned into a capacitive insulating film, is deposited by plasma-enhanced RF sputtering over the first metal film 25. In this process step, no gate electrode opening 21a has been formed yet in the insulating film 21. Accordingly, even if the $SrTiO_3$ film 26 is deposited by the plasma-enhanced RF sputtering, the channel region of the semiconductor substrate 20 (where electrons travel) receive no damage, thus maintaining excellent crystalline structure. Thereafter, a second metal film 27, which is made of Ti and Pt layers alternately stacked and which will be patterned into an upper electrode, is deposited on the $SrTiO_3$ film 26.

Figure 5E:
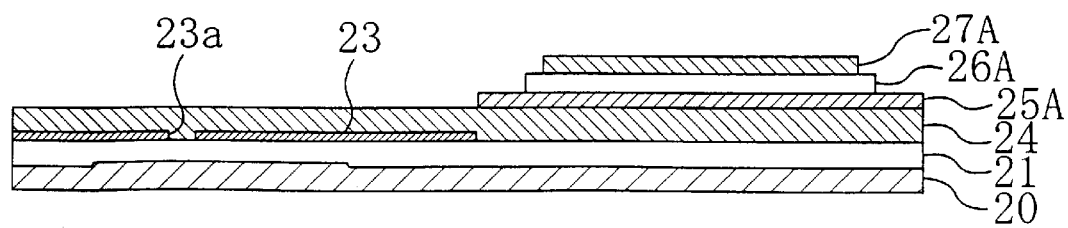

Next, the second metal film 27, $SrTiO_3$ film 26 and first metal film 25 are patterned in this order by a known ion milling technique, thereby forming a capacitor consisting of upper electrode 27A, capacitive insulating film 26A and lower electrode 25A as shown in FIG. 5E.

Figure 6A:
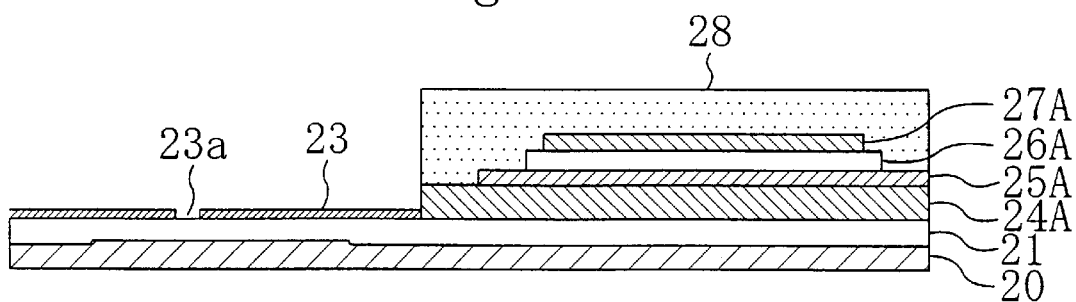

Thereafter, a second resist pattern 28 is defined over the protective film 24 to cover the capacitor as shown in FIG. 6A. Then, the protective film 24 is dry-etched using $CF_4$ gas and the second resist pattern 28 as a mask, thereby forming a pattern protective film 24A under the capacitor. In the illustrated embodiment, the hard mask 23 of aluminum is hardly etched and the insulating film 21 made of silicon dioxide is etched to a certain depth as a result of the dry etching process using $CF_4$ gas. But this causes no serious problem in the process.

Figure 6B:
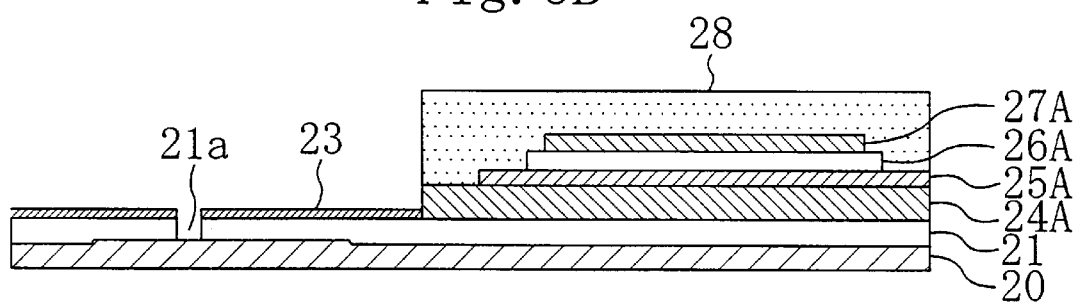

Next, as shown in FIG. 6B, the insulating film 21 is dry-etched with $CHF_3$ gas using the hard mask 23 and the second resist pattern 28 as a mask, thereby forming a gate electrode opening 21a of a very small size in the insulating film 21.

Figure 6C:
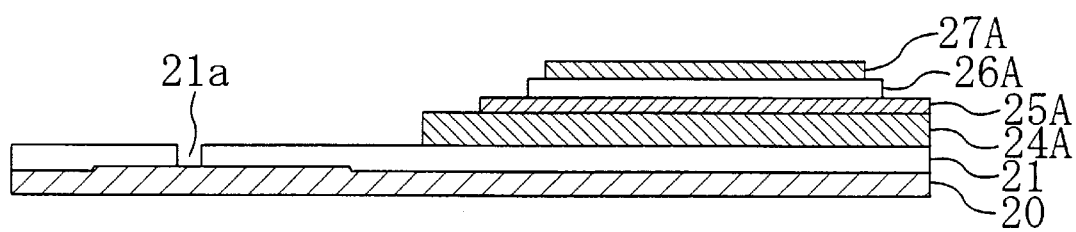
Figure 6D:
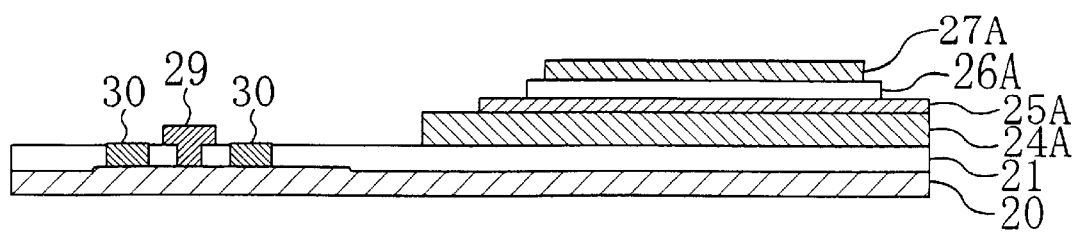
Figure 7A:
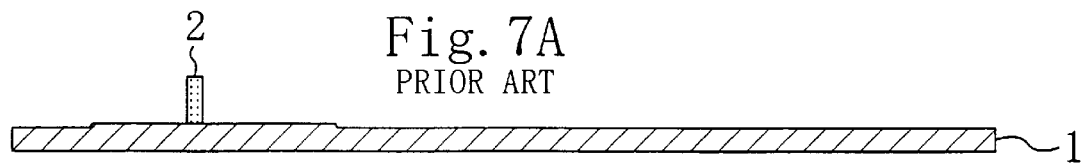
FIGS. 7A through 7F are cross-sectional views illustrating respective process steps for fabricating a semiconductor integrated circuit device according to a first prior art example.
Figure 7B:
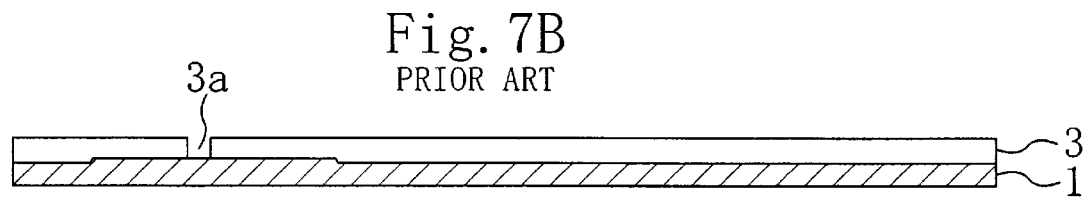
Figure 7C:
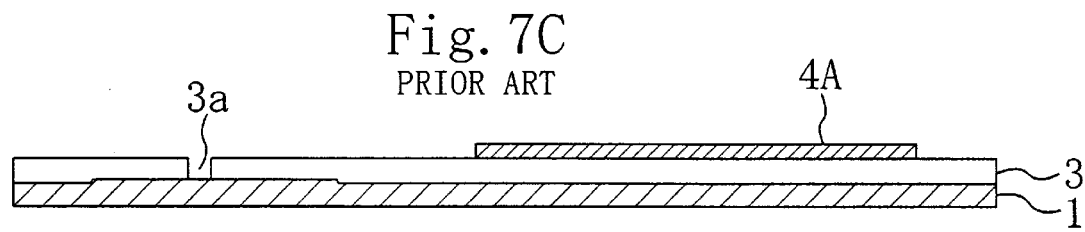
Figure 7D:
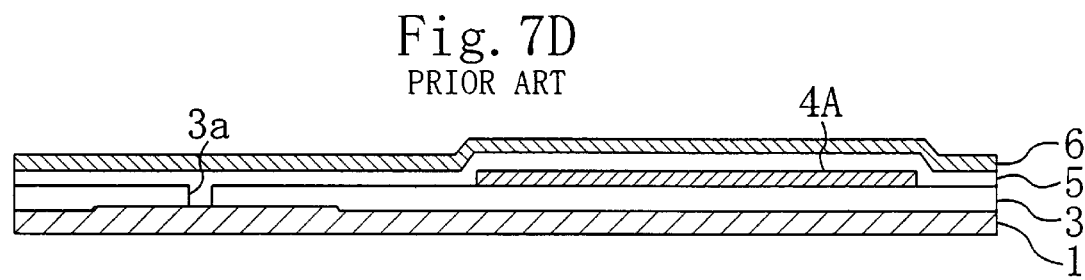
Figure 7E:
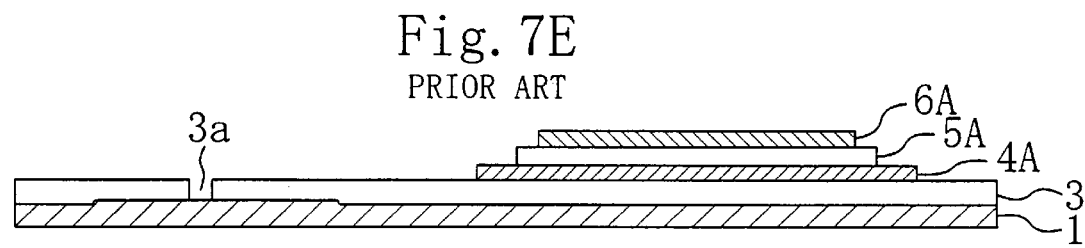
Figure 7F:
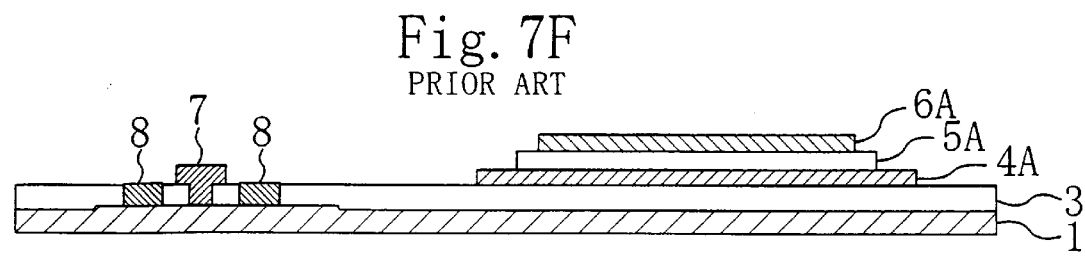
Figure 8:
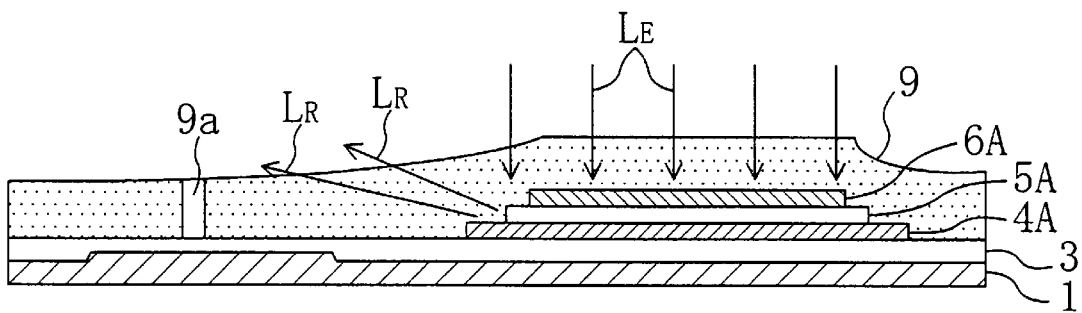
FIG. 8 is a cross-sectional view illustrating a process step for fabricating a semiconductor integrated circuit device according to a second prior art example.

Then, as shown in FIG. 6C, the hard mask 23 and second resist pattern 28 are removed. Finally, as shown in FIG. 6D, metallization is carried out to fill in the gate electrode opening 21a of the insulating film 21 and thereby form a gate electrode 29. Also, ohmic electrodes 30 are formed as source/drain electrodes on right- and left-hand sides of the gate electrode 29. As a result, a semiconductor integrated circuit device including FET and capacitor according to the second embodiment is obtained.

In the method of the second embodiment, when the $SrTiO_3$ film 26 is deposited by plasma-enhanced RF sputtering, no gate electrode opening 21a has been formed yet in the insulating film 21. Therefore, the channel region of the semiconductor substrate 20 (where electrons travel) receives no damage. Consequently, the electron mobility does not decrease in the channel region, thus preventing the operating characteristics of the field effect transistor from being deteriorated.

In the foregoing second embodiment, the protective film 24 of silicon nitride is deposited on the insulating film 21 of silicon dioxide. Alternatively, a protective film 24 of silicon dioxide may be deposited on an insulating film 21 of silicon nitride. Specifically, when the insulating film 21 is made of silicon dioxide or silicon nitride, the protective film 24 may be a single- or multi-layer film including at least one of aluminum, titanium, gold and tungsten films.

What is claimed is:

1. A method for fabricating a semiconductor integrated circuit device, comprising the steps of:
    a) forming an insulating film over the entire surface of a semiconductor substrate including a channel region for a field effect transistor, the insulating film having a gate electrode opening over the channel region;
    b) depositing a protective film over the entire surface of the insulating film;
    c) forming a lower electrode, a capacitive insulating film and an upper electrode in this order in a region on the protective film where a capacitor will be formed;
    d) removing part of the protective film, with which the gate electrode opening of the insulating film has been filled in, thereby exposing the semiconductor substrate within the gate electrode opening; and
    e) forming a gate electrode to fill in the gate electrode opening again.

2. The method of claim 1, wherein the step a) comprises the sub-steps of:
    i) defining a resist pattern on the semiconductor substrate by a phase-shifting technique, the resist pattern being in a shape corresponding to the opening of the insulating film;
    ii) depositing the insulating film over the entire surface of the semiconductor substrate as well as over the resist pattern; and
    iii) lifting the resist pattern off to form the gate electrode opening in the insulating film.

3. The method of claim 1, wherein the insulating film is made of silicon dioxide, and
    wherein the protective film is made of silicon nitride.

4. The method of claim 1, wherein the insulating film is made of silicon nitride, and
    wherein the protective film is made of silicon dioxide.

5. The method of claim 1, wherein the insulating film is made of silicon dioxide or silicon nitride, and
    wherein the protective film comprises at least one film selected from the group consisting of aluminum, titanium, gold and tungsten films.

6. The method of claim 1, wherein the capacitive insulating film contains a titanium oxide.

7. A method for fabricating a semiconductor integrated circuit device, comprising the steps of:

a) forming an insulating film over the entire surface of a semiconductor substrate including a channel region for a field effect transistor;

b) defining a mask pattern on the insulating film, the mask pattern having an opening over the channel region;

c) depositing a protective film over the entire surface of the insulating film as well as over the mask pattern;

d) forming a lower electrode, a capacitive insulating film and an upper electrode in this order in a region on the protective film where a capacitor will be formed;

e) removing part of the protective film, thereby exposing the insulating film inside the opening of the mask pattern, the part removed being located in a region where the field effect transistor will be formed;

f) etching the insulating film through the mask pattern, thereby forming a gate electrode opening in the insulating film; and g) forming a gate electrode to fill in the gate electrode opening.

8. The method of claim 7, wherein the step b) comprises the sub-steps of:

i) defining a resist pattern on the insulating film by a phase-shifting technique, the resist pattern being in a shape corresponding to the opening;

ii) depositing a mask-pattern-prototype film over the entire surface of the insulating film as well as over the resist pattern; and iii) lifting the resist pattern off to form the opening in the mask-pattern-prototype film.

9. The method of claim 7, wherein the insulating film is made of silicon dioxide or silicon nitride, and wherein the mask pattern comprises at least one of aluminum and gold films.

10. The method of claim 7, wherein the capacitive insulating film contains a titanium oxide.

11. A method for fabricating a semiconductor integrated circuit device, comprising the steps of:

a) forming an insulating film over the entire surface of a semiconductor substrate including a channel region for a field effect transistor, the insulating film having a gate electrode opening over the channel region;

b) forming a lower electrode in a region on the insulating film where a capacitor will be formed;

c) forming a protective film over the insulating film to cover surrounding regions of the lower electrode and the gate electrode opening of the insulating film, the protective film having an opening over a center region of the lower electrode;

d) forming a capacitive insulating film over the lower electrode and the protective film such that part of the capacitive insulating film comes into contact with the lower electrode through the opening of the protective film;

e) forming an upper electrode on the capacitive insulating film;

f) removing part of the protective film, with which the gate electrode opening of the insulating film has been filled in, thereby exposing the semiconductor substrate within the gate electrode opening; and g) forming a gate electrode to fill in the gate electrode opening.

* * * * *